(12) United States Patent
Lee et al.

(10) Patent No.: US 8,766,262 B2
(45) Date of Patent: Jul. 1, 2014

(54) ORGANIC LIGHT-EMITTING DISPLAY DEVICE PREVENTING EDGE DEFECTS BETWEEN PIXEL DEFINE LAYER AND PIXEL ELECTRODE, AND METHOD OF MANUFACTURING THE SAME

(75) Inventors: Dong-Won Lee, Yongin (KR); Young-Il Kim, Yongin (KR); Seong-Ho Kim, Yongin (KR)

(73) Assignee: Samsung Display Co., Ltd., Giheung-Gu, Yongin, Gyeonggi-Do (KR)

(*) Notice: Subject to any disclaimer, the term of this patent is extended or adjusted under 35 U.S.C. 154(b) by 155 days.

(21) Appl. No.: 13/013,235

(22) Filed: Jan. 25, 2011

(65) Prior Publication Data

US 2011/0278575 A1 Nov. 17, 2011

(30) Foreign Application Priority Data

May 11, 2010 (KR) .................. 10-2010-0044049

(51) Int. Cl.
*H01L 29/04* (2006.01)

(52) U.S. Cl.
USPC .................. 257/59; 257/E51.018; 438/34

(58) Field of Classification Search
CPC ............ H01L 27/3246; H01L 27/1214; H01L 51/5206; H01L 2251/5315; H01L 27/12; H01L 51/5237; H01L 27/3244; H01L 51/5203
USPC .................. 257/40, 59, E51.018; 438/34
See application file for complete search history.

(56) References Cited

U.S. PATENT DOCUMENTS

| | | | |
|---|---|---|---|
| 2001/0019133 A1* | 9/2001 | Konuma et al. | 257/79 |
| 2006/0022587 A1 | 2/2006 | Jeong et al. | |
| 2007/0046186 A1* | 3/2007 | Kim | 313/504 |
| 2008/0150419 A1 | 6/2008 | Kang | |
| 2008/0157080 A1* | 7/2008 | Gruner et al. | 257/59 |
| 2008/0272381 A1 | 11/2008 | Noguchi | |
| 2009/0278131 A1* | 11/2009 | Kwon et al. | 257/72 |
| 2011/0057208 A1* | 3/2011 | Jeon et al. | 257/88 |

FOREIGN PATENT DOCUMENTS

| | | |
|---|---|---|
| KR | 10-2005-0115705 A | 12/2005 |
| KR | 10-0547502 | 1/2006 |
| KR | 10-2006-0057945 A | 5/2006 |
| KR | 10-0746163 | 7/2007 |
| KR | 10-2007-0080105 | 8/2007 |
| KR | 10-2007-0086154 | 8/2007 |
| KR | 10-2008-0057584 A | 6/2008 |
| KR | 10-2009-0001375 | 1/2009 |
| KR | 10-2009-0052277 | 5/2009 |

OTHER PUBLICATIONS

Korean Registration Determination Certificate issued on May 2, 2012 in the corresponding Korean patent application No. 10-2010-0044049.

* cited by examiner

*Primary Examiner* — Mark A. Laurenzi, III
*Assistant Examiner* — Duy T Nguyen
(74) *Attorney, Agent, or Firm* — Robert E. Bushnell, Esq.

(57) ABSTRACT

An organic light-emitting display device preventing edge defects between a pixel define layer and a pixel electrode, and a method of manufacturing the same. The organic light-emitting display device, comprises: a substrate; a pixel electrode disposed on the substrate and comprising a first patterned unit and a second patterned unit which are electrically disconnected; a pixel define unit disposed on the substrate and exposing the pixel electrode; an intermediate layer disposed on the pixel electrode and emitting light; and a counter electrode disposed on the intermediate layer and the pixel define layer.

21 Claims, 8 Drawing Sheets

ORGANIC LIGHT-EMITTING DISPLAY DEVICE PREVENTING EDGE DEFECTS BETWEEN PIXEL DEFINE LAYER AND PIXEL ELECTRODE, AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on May 11, 2010 and there duly assigned Serial No. 10-2010-0044049.

BACKGROUND OF THE INVENTION

1. Field of the Invention

The present invention relates to an organic light-emitting display device and a method of manufacturing the same, and more particularly, to an organic light-emitting display device preventing edge defects between a pixel define layer and a pixel electrode, and a method of manufacturing the organic light-emitting display device.

2. Description of the Related Art

In general, flat display devices are largely classified into a light-emitting type and a light-receiving type. Examples of a light-emitting type include a flat cathode ray tube, a plasma display panel, an electroluminescent device, and a light-emitting diode. Examples of a light-receiving type include a liquid crystal display. Electroluminescent devices have a wide viewing angle, excellent contrast, and quick response speeds, and thus they have come into the spotlight as next generation display devices. The electroluminescent devices are classified into inorganic electroluminescent devices and organic light-emitting display devices based on the material used to form an emission layer (EML).

The organic light-emitting display device, which is a self-emitting display apparatus in which light is emitted by excitation of a fluorescent organic material, is driven at a low voltage, is thin, and has a wide viewing angle and quick response speeds, and thus it may be used as next generation display devices.

An organic light-emitting display device includes an anode, a cathode, and an EML formed of an organic material and disposed between the anode and the cathode. When an anode voltage and a cathode voltage are applied to the anode and the cathode, respectively, holes are transported from the anode to an EML through a hole transport layer (HTL), and electrons are transported from the cathode to the EML through an electron transport layer (ETL). The holes and the electrons are combined in the EML, and thus excitons are generated.

When the exciton is changed from an excited state to a ground state, fluorescent molecules of the EML emit light, thereby forming an image. A full color type organic light-emitting display device may realize full color by using pixels emitting Red®, green (G), and blue (B) lights.

The organic light-emitting display devices include a pixel define layer at each end of the anode. A predetermined opening is formed in the pixel define layer, and then the EML and the cathode are sequentially formed on top of the anode exposed through the opening in the pixel define layer.

SUMMARY OF THE INVENTION

The present invention provides an organic light-emitting display device preventing edge defects between a pixel define layer and a pixel electrode and a method of manufacturing the same.

According to an aspect of the present invention, an organic light-emitting display device comprises: a substrate; a pixel electrode disposed on the substrate and including a first patterned unit and a second patterned unit which are electrically disconnected; a pixel define unit disposed on the substrate and exposing the pixel electrode; an intermediate layer disposed on the pixel electrode and emitting light; and a counter electrode disposed on the intermediate layer and the pixel define layer.

The first patterned unit may be spaced apart from the second patterned unit so as to be electrically disconnected from the second patterned unit.

The second patterned unit may be disposed at outer sides of the first patterned unit.

The second patterned unit may be disposed so as to be spaced apart from the first patterned unit and to surround the first patterned unit.

The second patterned unit may be disposed at an edge of the first patterned unit so as to be spaced apart from the first patterned unit.

The second patterned unit may be disposed at opposing sides of the first patterned unit so as to be spaced apart from the first patterned unit.

The intermediate layer disposed on the first patterned unit emits light, and the intermediate layer disposed on the second patterned unit does not emit light.

The intermediate layer may be formed by inkjet printing.

The organic light-emitting display device may further include: a pixel circuit unit disposed between the substrate and the pixel electrode and electrically connected to the pixel electrode; and an insulating layer disposed between the pixel circuit unit and the pixel electrode.

The pixel circuit unit may be a thin-film transistor.

The pixel circuit unit may be disposed on the substrate so as to correspond to the pixel define layer.

The pixel circuit unit may be disposed on the substrate so as to correspond to the pixel electrode.

According to another aspect of the present invention, a method of manufacturing an organic light-emitting display device comprises: forming a pixel electrode on a substrate; patterning the pixel electrode into a first patterned unit and a second patterned unit which are electrically disconnected; forming a pixel define layer so as to expose a portion of the pixel electrode; forming an intermediate layer on the pixel electrode; and forming a counter electrode on the pixel define layer and the pixel electrode.

The first patterned unit and the second patterned unit may be formed by photolithography.

The first patterned unit may be spaced apart from the second patterned unit so as to be electrically disconnected from the second patterned unit.

The second patterned unit may be disposed at outer sides of the first patterned unit.

The second patterned unit may be disposed so as to be spaced apart from the first patterned unit and so surround the first patterned unit.

The second patterned unit may be disposed at an edge of the first patterned unit so as to be spaced apart from the first patterned unit.

The second patterned unit may be disposed at opposing sides of the first patterned unit so as to be spaced apart from the first patterned unit.

The intermediate layer disposed on the first patterned unit emits light, and the intermediate layer disposed on the second patterned unit does not emit light.

The intermediate layer may be formed by inkjet printing.

The method may further include: forming a pixel circuit unit on the substrate; forming an insulating layer so as to cover the pixel circuit unit; and forming a contact hole in the insulating layer so as to expose a portion of the pixel circuit unit before forming the pixel electrode; wherein the pixel electrode is electrically connected to the pixel circuit unit via the contact hole.

The pixel circuit unit may be a thin-film transistor.

The pixel circuit unit may be disposed on the substrate so as to correspond to the pixel define layer.

The pixel circuit unit may be disposed on the substrate so as to correspond to the pixel electrode.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Hereinafter, the present invention will be described more fully with reference to the accompanying drawings, in which exemplary embodiments of the invention are shown.

Figure 1:
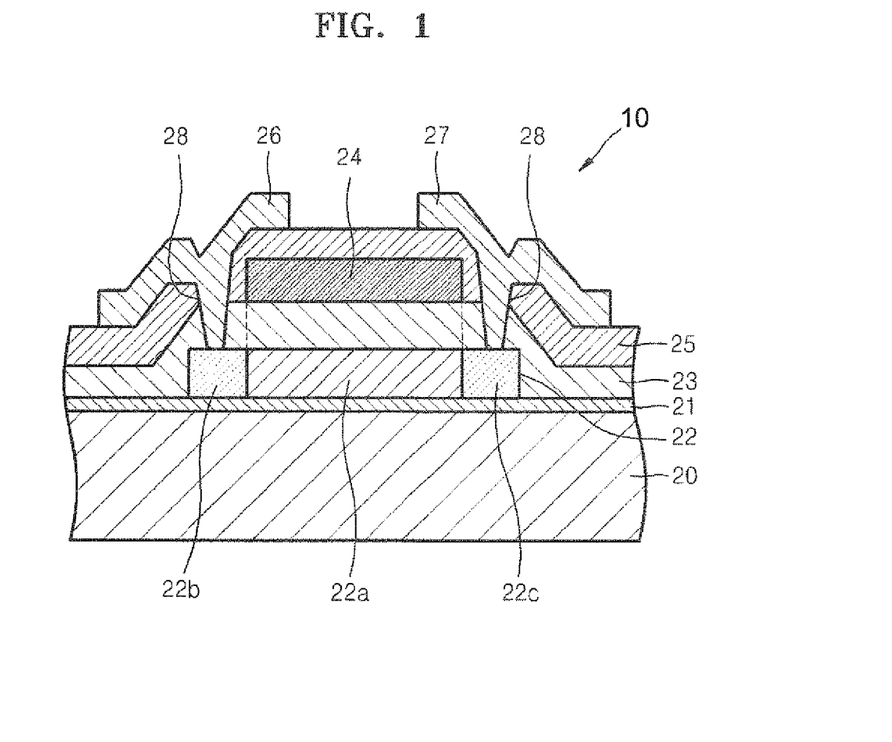
FIG. 1 is a cross-sectional view of a pixel circuit unit according to an embodiment of the present invention.

FIG. 1 is a cross-sectional view of a pixel circuit unit according to an embodiment of the present invention.

Referring to FIG. 1, the pixel circuit unit may be a thin-film transistor (TFT) 10. The TFT 10 may be disposed on a substrate 20. The substrate 20 may be a glass substrate or a plastic substrate.

A buffer layer 21 is disposed on the substrate 20, an active layer 22, including a semiconductor material, is disposed on the buffer layer 21, and a gate insulating layer 23 is disposed so as to cover the active layer 22. A gate electrode 24 is disposed on the gate insulating layer 23, an interlayer insulating layer 25 is disposed so as to cover the gate electrode 24, and source and drain electrodes 26 and 27, respectively, are disposed on the interlayer insulating layer 25. The source and drain electrodes 26 and 27, respectively, are formed so as to contact source and drain regions 22b and 22c, respectively, of the active layer 22 via contact holes 28 formed in the gate insulating layer 23 and the interlayer insulating layer 25.

The active layer 22 disposed on the substrate 20 may be formed of an inorganic semiconductor or an organic semiconductor. The source and drain regions 22b and 22c, respectively, are doped with n-type or p-type impurities, and a channel region 22a is formed between the source region 22b and the drain region 22c so as to connect the source region 22b and the drain region 22c.

The inorganic semiconductor used to form the active layer 22 may include CdS, GaS, ZnS, CdSe, CaSe, ZnSe, CdTe, SiC, or Si.

In addition, the organic semiconductor used to form the active layer 22 may include polymers such as polythiophene and derivatives thereof, polyparaphenylenevinylene and derivatives thereof, polyparaphenylene and derivatives thereof, polyfluorene and derivatives thereof, polythiophenevinylene and derivatives thereof, and polythiophene-hereto ring aromatic copolymer and derivatives thereof, and small molecules such as oligoacene of pentacene, tetracene, and naphthalene and derivatives thereof, oligothiophene of alpha-6-thiophene and alpha-5-thiophene and derivatives thereof, phthalocyanine containing or not containing a metal and derivatives thereof, pyromellitic dianhydride or pyromellitic diimide and derivatives thereof, and perylenetetracarboxylate dianhydride or perylenetetracarboxylic diimide and derivatives thereof.

The active layer 22 is covered with the gate insulating layer 23, and the gate electrode 24 is disposed on the gate insulating layer 23. The gate electrode 24 may be a conductive metal layer such as MoW, Al, Cr or Al/Cu, but is not limited thereto. Various conductive materials, such as a conductive polymer, may be used to form the gate electrode 24. The gate electrode 24 is formed so as to cover a region corresponding to the channel region 22a of the active layer 22.

Figure 2:
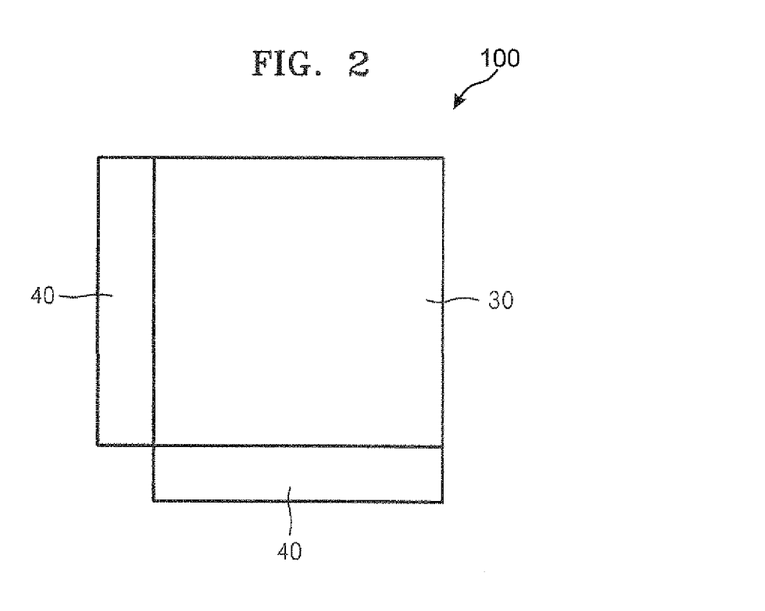
FIG. 2 is a plan view of an organic light-emitting display device according to an embodiment of the present invention.

FIG. 2 is a plan view of an organic light-emitting display device according to an embodiment of the present invention.

Referring to FIG. 2, the organic light-emitting display device 100 includes a pixel region 30 and circuit regions 40 formed at edges of the pixel region 30. The pixel region 30 includes a plurality of pixels, and each of the pixels includes an emission unit which emits light so as to realize an image.

According to the current embodiment, the emission unit includes a plurality of sub-pixels respectively including an organic light emitting device. In a full color organic light-emitting display device, red (R), green (G), and blue (B) sub-pixels are arranged in various patterns, including a line pattern, a mosaic pattern, a lattice pattern, etc., to constitute pixels. Also, the full color organic light-emitting display device 100 may be a mono color flat panel display device or not a full color flat panel display device.

The circuit regions 40 control, for example, an image signal which is input to the pixel region 30.

In the organic light-emitting display device 100 according to the current embodiment, at least one TFT may be installed in each of the pixel region 30 and the circuit regions 40.

The TFT installed in the pixel region 30 may include a pixel TFT, such as a switching TFT which transmits a data signal to an organic light-emitting device according to a gate line signal so as to control the operation of the organic light emitting device, and a driving TFT which drives the organic light-emitting device by supplying current according to the data signal. The TFT installed in the circuit region 40 may include a circuit TFT constituted so as to implement a predetermined circuit.

The number and alignment of the TFT may vary according to characteristics of a display and driving methods thereof.

Figure 3:
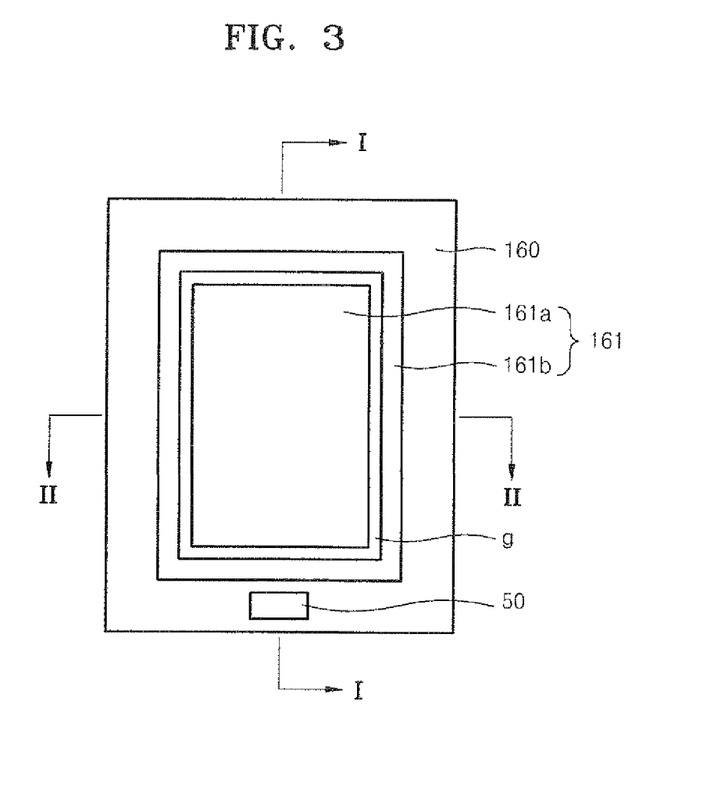
FIG. 3 is a plan view of a sub-pixel of the organic light-emitting display device of FIG. 2.
Figure 4:
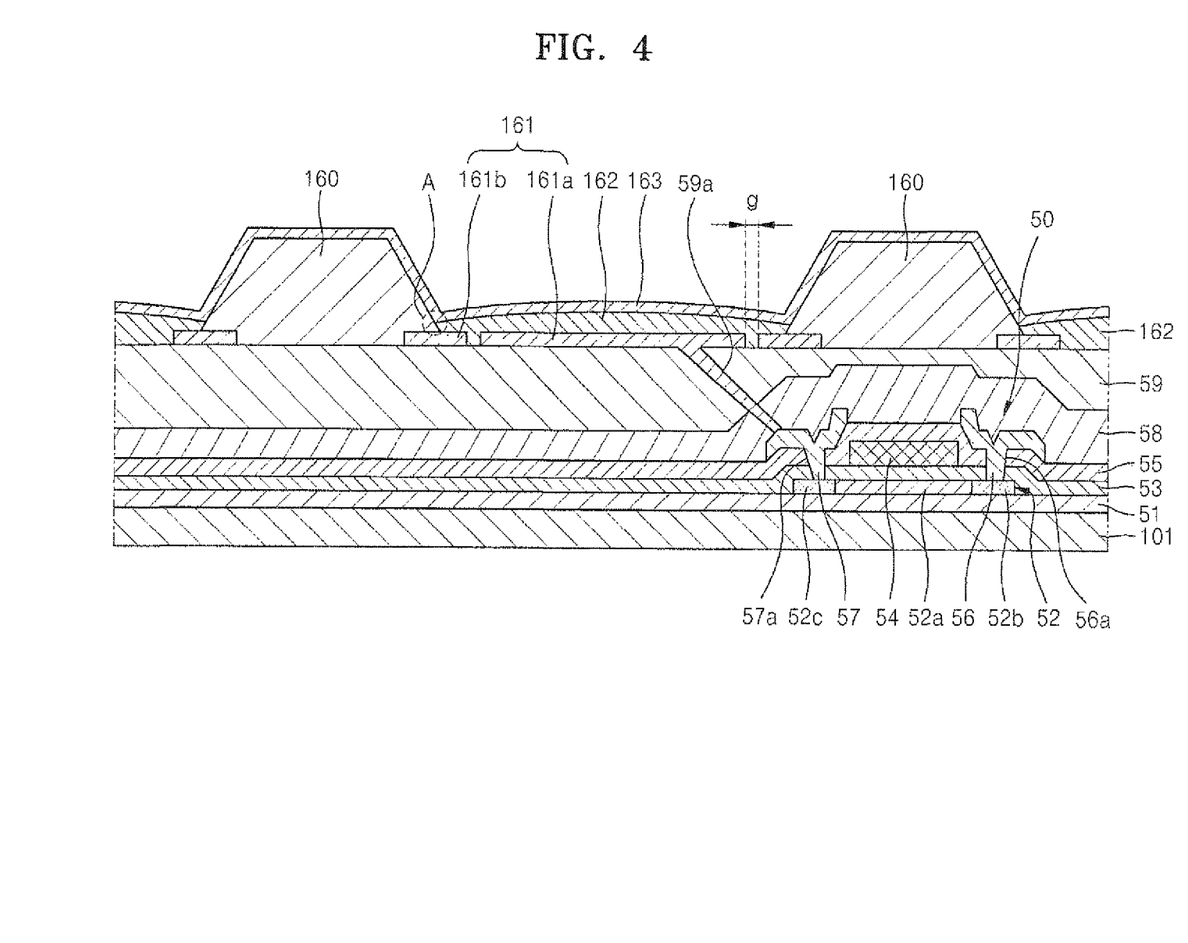
FIG. 4 is a cross-sectional view taken along line I-I of FIG. 3.
Figure 5:
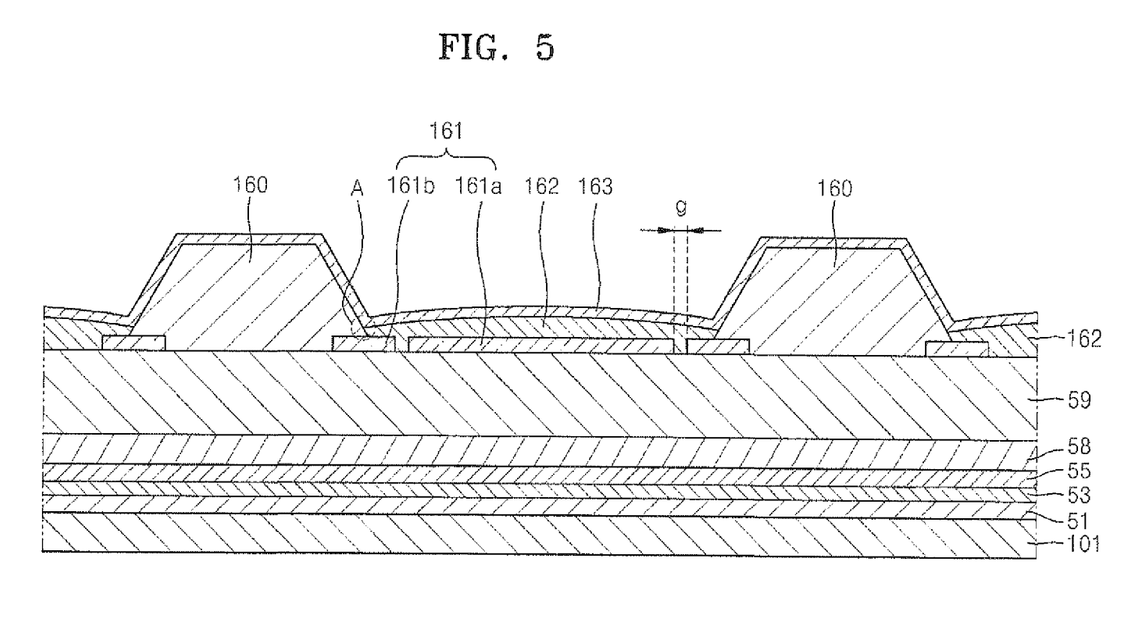
FIG. 5 is a cross-sectional view taken along line II-II of FIG. 3.

FIG. 3 is a plan view of a sub-pixel of the organic light-emitting display device of FIG. 2, FIG. 4 is a cross-sectional view taken along line I-I of FIG. 3, and FIG. 5 is a cross-sectional view taken along line II-II of FIG. 3.

Referring to FIGS. 3 thru 5, a buffer layer 51 (FIGS. 4 and 5) is disposed on a glass or plastic substrate 101, and a pixel circuit unit 50 (FIGS. 3 and 4) and an organic light-emitting device are disposed thereon. The pixel circuit unit 50 may be various TFTs, such as a top gate TFT and a bottom gate TFT.

An active layer 52 (FIG. 4) having a predetermined pattern is formed on the buffer layer 51. A gate insulating layer 53 is formed on the active layer 52, and a gate electrode 54 is formed in a predetermined region of the gate insulating layer 53. The gate electrode 54 is connected to a gate line (not shown) through which a signal for turning on and/or off the TFT is applied. An interlayer insulating layer 55 is disposed on the gate electrode 54. Source and drain electrodes 56 and 57, respectively, are disposed on the interlayer insulating layer 55 so as to contact source and drain regions 52b and 52c, respectively, of the active layer 52 through contact holes 56a and 57a, respectively. An insulating layer may be disposed on the source and drain electrodes 56 and 57, respectively. The insulating layer may include a passivation layer 58 formed of SiO2, SiNx, or the like, or a planarization layer 59 disposed on the passivation layer 58 and formed of an organic material, such as acryl, polyimide, and benzocyclobutene (BCB).

A pixel electrode 161 (FIGS. 3 thru 5), which functions as an anode of the organic light-emitting display device, is disposed on the planarization layer 59. A pixel define layer 160 covers the pixel electrode 161, and may be formed of an organic material. The pixel circuit unit 50 may be disposed on the substrate 101 in correspondence to the pixel define layer 160.

An opening is formed in the pixel define layer 160, and an intermediate layer 162 is formed on the pixel define layer 160 and on the pixel electrode 161 exposed through the opening of the pixel define layer 160. The intermediate layer 162 includes an emission layer (EML). The structure of the organic light-emitting display device is not limited to that described above, and various structures of organic light-emitting display devices may be used.

The organic light-emitting device displays predetermined image information by emitting red, green and blue light as current flows. The organic light-emitting device includes: the pixel electrode 161, which is connected to the drain electrode 57 of the TFT, and to which a positive power voltage is applied; a counter electrode 163, which is formed so as to cover the entire pixel, and to which a negative power voltage is applied; and the intermediate layer 162 which is disposed between the pixel electrode 161 and the counter electrode 163 so as to emit light.

The pixel electrode 161 and the counter electrode 163 are insulated from each other by the intermediate layer 162, and respectively apply voltages of opposite polarities to the intermediate layer 162 so as to induce light emission in the intermediate layer 162.

The intermediate layer 162 may comprise a low-molecular weight organic layer or a high-molecular weight organic layer. When a low-molecular weight organic layer is used as the intermediate layer 162, the intermediate layer 162 may have a single or multi-layer structure including at least one selected from the group consisting of a hole injection layer (HIL), a hole transport layer (HTL), an emission layer (EML), an electron transport layer (ETL), and an electron injection layer (EIL). The low-molecular weight organic layer may be formed of an organic material. Examples of available organic materials include copper phthalocyanine (CuPc), N,N'-di(naphthalene-1-yl)-N,N'-diphenyl-benzidine (NPB), and tris-8-hydroxyquinoline aluminum (Alq3). The low-molecular weight organic layer may be formed by vacuum deposition.

When a high-molecular weight organic layer is used as the intermediate layer 162, the intermediate layer 162 may mostly have a structure including an HTL and an EML. In this case, the HTL may be formed of poly(ethylenedioxythiophene) (PEDOT), and the EML may be formed of polyphenylenevinylenes (PPVs) or polyfluorenes. The HTL and the EML may be formed by screen printing, inkjet printing, or the like.

The intermediate 162 is not limited thereto, and thus, various types of intermediate layers may be applied.

The intermediate layer 162 may be formed by inkjet printing. The intermediate layer 162 may also be formed by spin coating.

The pixel electrode 161 functions as an anode, and the counter electrode 163 functions as a cathode. Alternatively, the pixel electrode 161 may function as a cathode, and the counter electrode 163 may function as an anode.

The pixel electrode 161 may be formed as a transparent electrode or a reflective electrode. The transparent electrode may be formed of indium tin oxide (ITO), indium zinc oxide (IZO), zinc oxide (ZnO), or indium oxide ($In_2O_3$). The reflective electrode may be formed by forming a reflective layer of silver (Ag), magnesium (Mg), aluminum (Al), platinum (Pt), palladium (Pd), gold (Au), nickel (Ni), neodymium (Nd), iridium (Ir), chromium (Cr) or a compound thereof, and forming a layer of ITO, IZO, ZnO, or $In_2O_3$ on the reflective layer.

The pixel electrode 161 may include a first patterned unit 161a and a second patterned unit 161b which are electrically disconnected. A gap g is formed between the first patterned unit 161a and the second patterned unit 161b, and the first patterned unit 161a is electrically disconnected from the second patterned unit 161b by the gap g. As shown in FIG. 3, the, second patterned unit 161b may be disposed at outer sides of the first patterned unit 161a so as to surround the first patterned unit 161a. The gap g shown in FIG. 3 has a tetragonal shale "□", but the shape is not limited thereto. The gap g may also have any shape such as a circular shape "○" such that the second patterned unit 161b surrounds the first patterned unit 161a.

The first patterned unit 161a and the second patterned unit 161b may be formed using a photolithography process. That is, a metal layer used to form the pixel electrode 161 is deposited on the planarization layer 59, and the first patterned unit 161a and the second patterned unit 161b may be patterned using a photolithography process.

The first patterned unit 161a is connected to the pixel circuit unit 50 via the contact hole 59a (FIG. 4). In other words, the first patterned unit 161a is connected to the drain electrode 57 of the TFT which is the pixel circuit unit 50 so that a positive power voltage is applied to the first patterned unit 161a. However, the second patterned unit 161b is electrically disconnected from the first patterned unit 161a so that a power voltage is not applied to the second patterned unit 161b. Accordingly, while the intermediate layer 162 disposed on the first patterned unit 161a emits light, the intermediate layer 162 disposed on the second patterned unit 161b does not emit light. Particularly, the intermediate layer 162 may be disposed on the pixel electrode 161, i.e., on the first patterned unit 161a and the second patterned unit 161b. However, since the first patterned unit 161a is electrically disconnected from the second patterned unit 161b, and the power voltage is applied only to the first patterned unit 161a, the intermediate layer 162 disposed on the first patterned unit 161a emits light, and the intermediate layer 162 disposed on the second patterned unit 161b does not emit light.

The intermediate layer 162, including the EML, is disposed on the pixel electrode 161 which is exposed by the pixel define layer 160. Due to a surface energy difference between the pixel define layer 160 and the pixel electrode 161, the intermediate layer 162 disposed at a boundary A (FIGS. 4 and 5) between the pixel define layer 160 and the pixel electrode 161 may be thinner than the intermediate layer 162 disposed at the center of the pixel electrode 161, or the intermediate layer 162 may not be formed at the boundary A. As such, if the intermediate layer 162 disposed at the boundary A is thinner than the intermediate layer 162 disposed at the center of the pixel electrode 161, or the intermediate layer 162 is not formed, edge defects occur so that the boundary A emits weak light or does not emit light. According to the present embodiment, the edge defects may be inhibited by electrically disconnecting the outer sides of the pixel electrode 161 (i.e., the second patterned unit 161b which is adjacent to pixel define layer 160) from the first patterned unit 161a disposed at the center of the pixel electrode 161. Unlike the boundary A, there is no surface energy difference in the first patterned unit 161a, and thus the thickness of the intermediate layer 162 disposed on the first patterned unit 161a may be uniform, and thus the sub-pixel may emit light having uniform brightness.

Also, the counter electrode 163 may be a transparent electrode or a reflective electrode. If the counter electrode 63 is a transparent electrode, the counter electrode 163 may be used as a cathode. Thus, a metal having a low work function (i.e., Li, Ca, LiF/Ca, LiF/Al, Al, Ag, Mg, or a compound thereof) may be deposited so as to face the intermediate layer 162. Then, an auxiliary electrode layer or a bus electrode line may be formed of a material for forming a transparent electrode, such as ITO, IZO, ZnO, or $In_2O_3$, on the metal in order to form the counter electrode 163. Otherwise, if the counter electrode 63 is a reflective electrode, the counter electrode 163 may be formed by depositing Li, Ca, LiF/Ca, LiF/Al, Al, Ag, Mg, or a compound thereof on the entire surface of the intermediate layer 162.

FIGS. 6 thru 9 are plan views of sub-pixels according to embodiments of the present invention.

That is, FIGS. 6 thru 9 show modifications in which the second patterned unit 161b is disposed at outer sides of the first patterned unit 161a.

Figure 6:
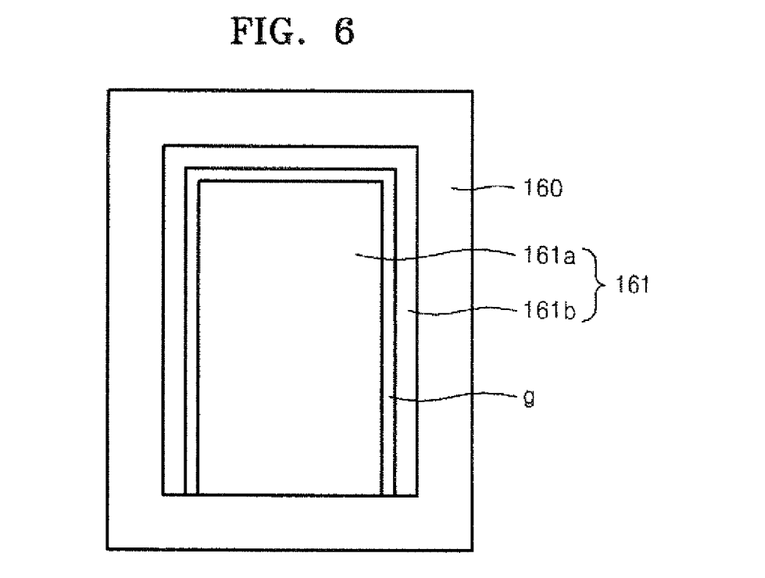
FIGS. 6 thru 9 are plan views of sub-pixels according to embodiments of the present invention.

Referring to FIG. 6, a "E"-shaped gap g is formed between the second patterned unit 161b and the first patterned unit 161a.

Figure 7:
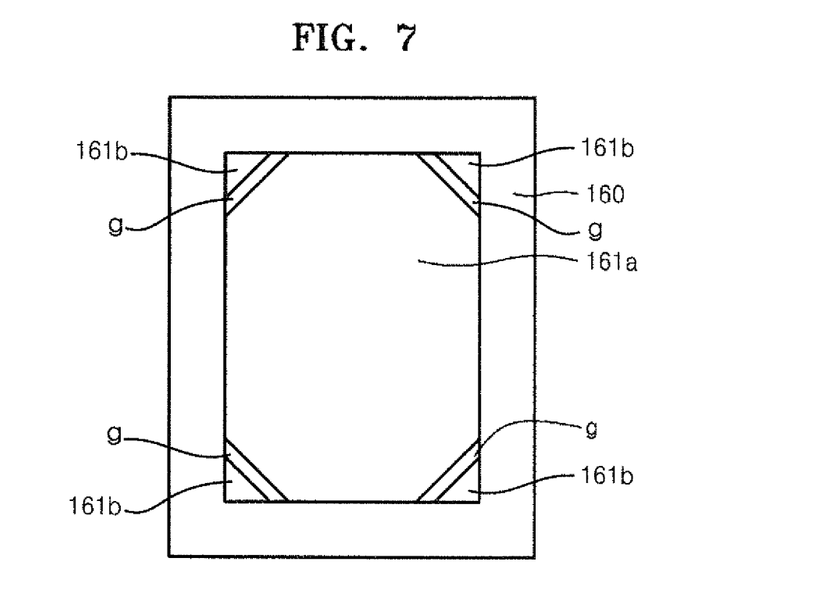

Referring to FIG. 7, the second patterned unit 161b is disposed at an edge of the pixel electrode 161, and a gap g is formed between the second patterned unit 161b and the first patterned unit 161a.

Figure 8:
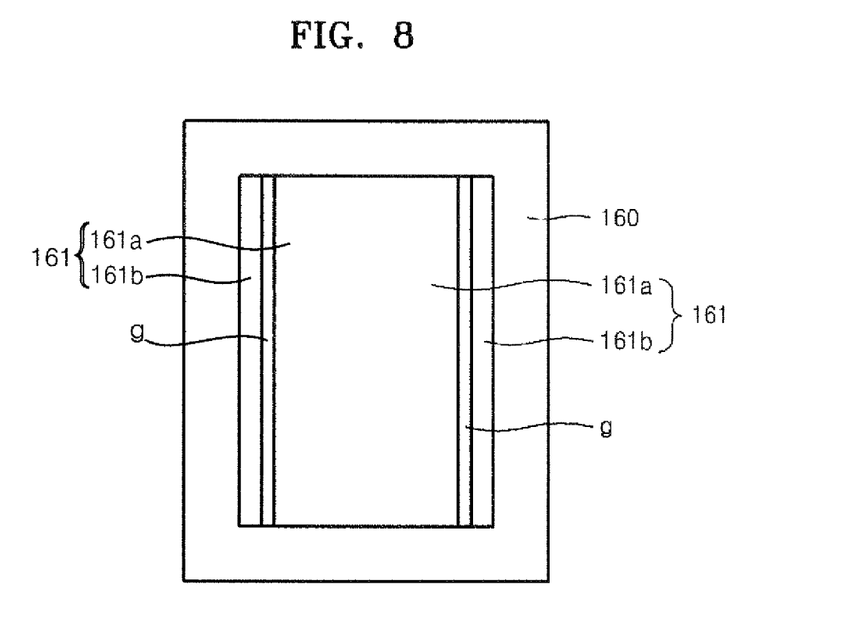
Figure 9:
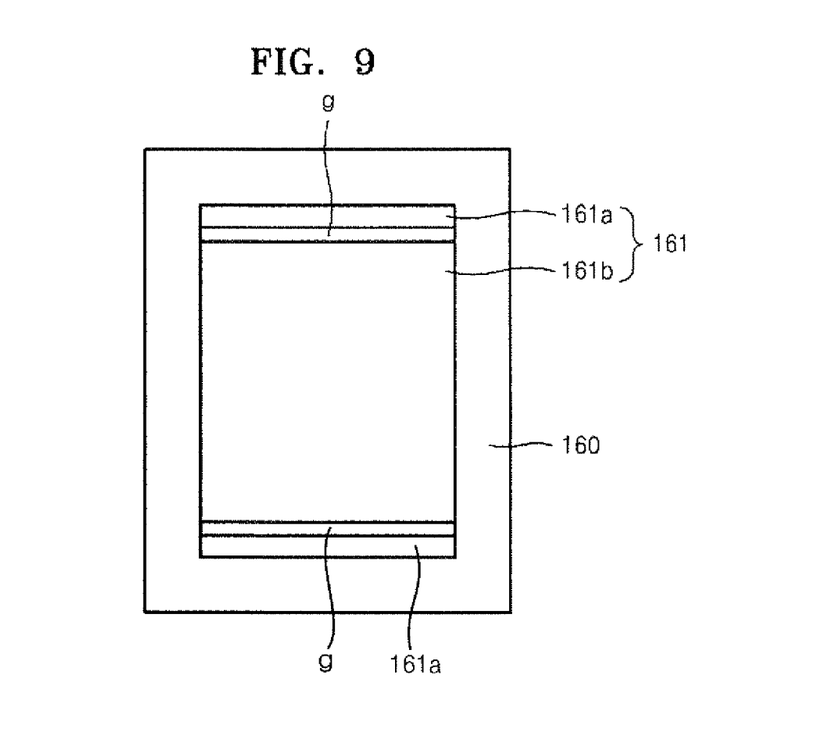

Referring to FIGS. 8 and 9, the second patterned units 161b may be disposed at opposing sides of the pixel electrode 161. In other words, as shown in FIG. 8, the second patterned units 161b may be disposed at right and left sides of the first patterned unit 161a so as to be spaced apart from the first patterned unit 161a by a gap g. As shown in FIG. 9, the second patterned units 161b may be disposed at upper and lower sides of the first patterned unit 161a so as to be spaced apart from the first patterned unit 161a by a gap g.

Figure 10:
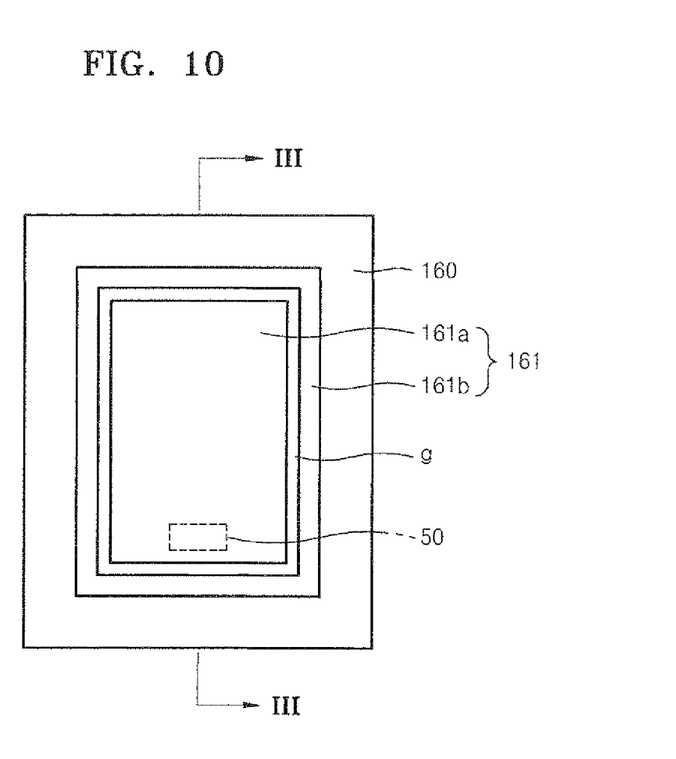
FIG. 10 is a plan view of an organic light-emitting display device according to another embodiment of the present invention.
Figure 11:
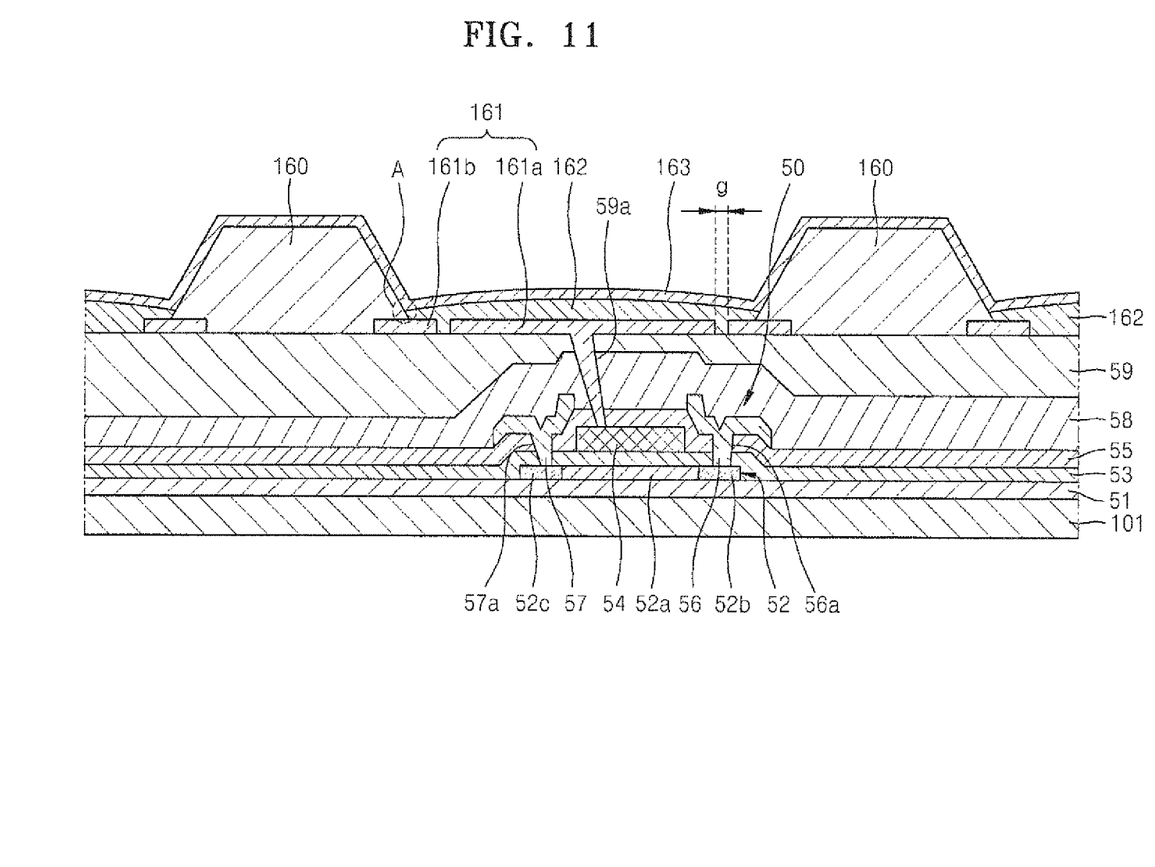
FIG. 11 is a cross-sectional view taken along line of FIG. 10.

FIG. 10 is a plan view of an organic light-emitting display device according to another embodiment of the present invention, and FIG. 11 is a cross-sectional view taken along line of FIG. 10.

The position of the pixel circuit unit 50 of the organic light-emitting display device shown in FIGS. 10 and 11 is different from that in the organic light-emitting display device shown in FIG. 3. In other words, referring to FIGS. 10 and 11, the pixel circuit unit 50 is disposed on the substrate 101 so as to correspond to the pixel electrode 161.

According to the present invention, edge defects occurring at a boundary between a pixel electrode and a pixel define layer may be prevented.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An organic light-emitting display device, comprising:
a substrate;
a pixel electrode disposed on the substrate and comprised of a first patterned unit and a second patterned unit which are electrically isolated from each other;
a pixel define unit disposed on the substrate and exposing a portion of the second patterned unit and at least an edge of the first patterned unit, the edge of the first patterned unit being a part of the first patterned unit toward the second patterned unit;
an intermediate layer disposed on the pixel electrode and emitting light;
a counter electrode disposed on the intermediate layer and the pixel define layer; and
a pixel circuit unit disposed between the substrate and the pixel electrode, the first patterned unit being electrically connected to the pixel circuit unit, and the second patterned unit not being electrically connected to any pixel circuit unit.

2. The organic light-emitting display device of claim 1, wherein the first patterned unit is spaced apart from the second patterned unit so as to be electrically isolated from the second patterned unit.

3. The organic light-emitting display device of claim 1, wherein the second patterned unit is disposed at outer sides of the first patterned unit.

4. The organic light-emitting display device of claim 1, wherein the second patterned unit is disposed so as to be spaced apart from the first patterned unit and has a loop shape surrounding the first patterned unit, and wherein the pixel define unit exposes the entire first patterned unit.

5. The organic light-emitting display device of claim 1, wherein the second patterned unit is disposed at the edge of the first patterned unit so as to be spaced apart from the first patterned unit.

6. The organic light-emitting display device of claim 1, wherein the second patterned unit is disposed at opposing sides of the first patterned unit so as to be spaced apart from the first patterned unit.

7. The organic light-emitting display device of claim 1, wherein the intermediate layer is disposed on both the first and second patterned units of the pixel electrode, the intermediate layer disposed on the first patterned unit emitting light, and the intermediate layer disposed on the second patterned unit not emitting light.

8. The organic light-emitting display device of claim 1, comprised of an inkjet print forming the intermediate layer.

9. The organic light-emitting display device of claim 1, further comprising an insulating layer disposed between the pixel circuit unit and the pixel electrode.

10. The organic light-emitting display device of claim 9, wherein the pixel circuit unit is a thin-film transistor.

11. The organic light-emitting display device of claim 9, wherein the pixel circuit unit is disposed on the substrate so as to correspond to the pixel define layer.

12. The organic light-emitting display device of claim 9, wherein the pixel circuit unit is disposed on the substrate so as to correspond to the pixel electrode.

13. The organic light-emitting display device of claim 1, the pixel circuit unit comprising a source electrode, a drain electrode and a gate electrode, the first patterned unit being electrically connected to one of the source electrode and the drain electrode.

14. The organic light-emitting display device of claim 13, further comprising a planarization layer and a passivation layer disposed between the pixel circuit unit and the pixel electrode, the first patterned unit being electrically connected to the pixel circuit unit through a contact hole formed in the planarization layer and the passivation layer.

15. A method of manufacturing an organic light-emitting display device, the method comprising the steps of:
    forming a pixel circuit on a substrate;
    forming a pixel electrode on the substrate;
    patterning the pixel electrode into a first patterned unit and a second patterned unit electrically isolated from the first patterned unit, the first patterned unit being electrically connected to the pixel circuit unit, and the second patterned unit not being electrically connected to any pixel circuit unit;
    forming a pixel define layer to expose a portion of the second pattered unit and at least an edge of the first patterned unit, the edge of the first patterned unit being a part of the first patterned unit toward the second patterned unit;
    forming an intermediate layer on the pixel electrode; and
    forming a counter electrode on the pixel define layer and the pixel electrode.

16. The method of claim 15, further comprising the steps of:
    forming an insulating layer to cover the pixel unit; and
    forming a contact hole in the insulating layer to expose a portion of the pixel circuit unit before forming the pixel electrode;
    wherein the pixel electrode is electrically connected to the pixel circuit unit via the contact hole.

17. An organic light-emitting display device manufactured by the method of claim 15, comprised of the first patterned unit spaced apart from the second patterned unit.

18. An organic light-emitting display device manufactured by the method of claim 15, comprised of the second patterned unit disposed at outer sides of the first patterned unit.

19. An organic light-emitting display device manufactured by the method of claim 15, comprised of the second patterned unit disposed to be spaced apart from the first patterned unit and surrounding the first patterned unit.

20. An organic light-emitting display device manufactured by the method of claim 15, comprised of the second patterned unit disposed at the edge of the first patterned unit and spaced apart from the first patterned unit.

21. An organic light-emitting display device manufactured by the method of claim 15, comprised of the intermediate layer disposed on both the first and second patterned units of the pixel electrode, the intermediate layer disposed on the first patterned unit emitting light, and the intermediate layer disposed on the second patterned unit not emitting light.

* * * * *